United States Patent [19]
Johansen

[11] Patent Number: 5,963,415
[45] Date of Patent: *Oct. 5, 1999

[54] ELECTROSTATIC DISCHARGE PROTECTION DEVICE

[75] Inventor: Arnold W. Johansen, Marlboro, Mass.

[73] Assignee: Polaroid Corporation, Cambridge, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/903,393

[22] Filed: Jul. 5, 1997

[51] Int. Cl.⁶ ......................................................... H05F 3/00
[52] U.S. Cl. ........................................... 361/212; 361/220
[58] Field of Search ...................................... 361/212, 220

[56] References Cited

U.S. PATENT DOCUMENTS

| | | | |
|---|---|---|---|
| 3,467,940 | 9/1969 | Wallo | 339/14 |
| 3,638,071 | 1/1972 | Altonen, Jr. et al. | 361/220 |
| 3,653,498 | 4/1972 | Kisor | 206/46 H |
| 3,774,075 | 11/1973 | Medesha | 317/2 R |
| 4,019,094 | 4/1977 | Dinger et al. | 361/220 |
| 4,179,178 | 12/1979 | Bachman et al. | 361/220 |
| 4,617,605 | 10/1986 | Obrecht et al. | 361/220 |
| 4,711,506 | 12/1987 | Tanaka | 361/220 |
| 4,780,604 | 10/1988 | Hasegawa et al. | 361/220 |
| 4,849,944 | 7/1989 | Matsushita | 361/212 |
| 4,971,568 | 11/1990 | Cronin | 439/188 |
| 5,002,495 | 3/1991 | Tanaka | 361/212 |
| 5,108,299 | 4/1992 | Cronin | 439/188 |
| 5,163,850 | 11/1992 | Cronin | 439/507 |
| 5,164,880 | 11/1992 | Cronin | 361/220 |
| 5,259,777 | 11/1993 | Schuder et al. | 439/188 |
| 5,289,336 | 2/1994 | Gagliano | 361/220 |
| 5,465,186 | 11/1995 | Bajorek et al. | 360/113 |
| 5,475,548 | 12/1995 | Rudi et al. | 361/220 |
| 5,490,033 | 2/1996 | Cronin | 361/212 |
| 5,491,605 | 2/1996 | Hughbanks et al. | 360/113 |
| 5,562,489 | 10/1996 | Cronin | 439/507 |
| 5,583,733 | 12/1996 | Cronin | 361/111 |
| 5,599,205 | 2/1997 | Cronin | 439/507 |
| 5,644,454 | 7/1997 | Arya et al. | 360/106 |

FOREIGN PATENT DOCUMENTS

| | | |
|---|---|---|
| 0071031 | 9/1983 | European Pat. Off. . |
| 0 314 187 | 5/1989 | European Pat. Off. . |
| 2348630 | 3/1975 | Germany . |
| 59-13353 | 1/1984 | Japan . |
| 61-148852 | 11/1986 | Japan . |
| 62-276855 | 1/1987 | Japan . |
| WO 96 38888 | 12/1996 | WIPO . |

OTHER PUBLICATIONS

Middlebrook, Carlton G., "Electrical Shorting Cap," *Navy Technical Disclosure Bulletin*, vol. 6, No. 3, Mar. 1981, pp. 33–36 (Navy Technology Catalog No. 5260 1530, Navy Case No. 63818).

Wang, Shay–Ping T., and Ogden, Paul, "Membrane–Type Pin Protector for Pin Grid Array Devices," 1991 IEEE/SEMI Advanced Semiconductor Manufacturing Conference, pp. 120–127.

EPO International Search Report dated Oct. 22, 1998.

*Primary Examiner*—Fritz Fleming
*Attorney, Agent, or Firm*—Barry Gaiman; Joseph T. Stecewycz

[57] ABSTRACT

An electrostatic discharge protection device is disclosed for use with a magnetic read-write transducer. The electrostatic discharge protection device electrically interconnects the conductive elements of magnetoresistive and inductive heads to provide a low resistance conductive path placing the conductive elements at a substantially equal electrical potential thus minimizing electrostatic discharge. The electrostatic discharge protection device provides an electrical path between the conductive elements which is manually or automatically removable upon connection to a mating element. The electrostatic discharge protection device has a resilient inward biased to connect the electrically conductive elements such that a ground is established between them and is removed automatically upon insertion of the conductive elements into a mating receptacle which is interposed between the conductive elements and the electrostatic discharge protection device or is manually disconnected.

14 Claims, 8 Drawing Sheets

ELECTROSTATIC DISCHARGE PROTECTION DEVICE

BACKGROUND OF THE INVENTION

1. Field of the Invention

The present invention relates generally to an electrostatic discharge protection devices, and in particular, to electrostatic discharge protection devices for protecting magnetic disk drives, such as a read/write transducer utilizing magnetoresistive sensors, against electrostatic discharge or electrical overstress during manufacturing and processing.

2. Description of the Prior Art

Magnetic head disk drive systems have been widely accepted in the computer industry as a cost-effective form of data storage. In a magnetic disk drive system, a magnetic recording medium in the form of a disk rotates at high speed, by means of a spindle drive motor for example, while a magnetic read/write transducer, referred to as a magnetic head, is suspended slightly above the surface of the rotating disk. The magnetic head is either attached to or formed integral with a flexure which is suspended over the disk on a spring-loaded support arm, known as a gimbal. An example of a magnetoresistive (hereinafter MR) head assembly 10 is shown in FIG. 1. MR head assembly 10 comprises, in relevant part, a gimbal 12 which supports an MR head 14 over the surface of a magnetic disk (not shown). The electrical impulses registered by MR head 14 pass through wires in gimbal 12 to a flex circuit 16. Flex circuit 16 has solder bumps 18 which are used to connect MR head assembly 10 to hard disk electronics (not shown) so as to allow reading from and writing to platters within the hard disk.

As the magnetic disk rotates at operating speed, the moving air generated by the rotating disk in conjunction with the physical design of the flexure operates to lift the magnetic head allowing it to glide slightly above the disk surface on a cushion of air, commonly referred to as an "air bearing cushion." The flying height of the magnetic head over the disk surface is typically only a few micrometers or less and is primarily a function of disk rotation, the aerodynamic properties of the flexure assembly, and the force exerted by the spring loaded gimbal.

One of the well-known problems encountered during the manufacture, handling and use of MR heads is the build-up and discharge of electrostatic charges on the various head components or on other objects which come into contact with the heads, especially thin-film heads. An electrostatic discharge (hereinafter ESD) occurs when electrostatic charge accumulates and builds up to eventually discharge to another surface of lower electrical potential. A sharp voltage spike caused by an electrostatic discharge can cause permanent and costly damage to individual parts of precision microelectronic devices.

Static charges may be produced by the presence of certain materials, such as plastics, during manufacture and subsequent handling of heads. These charges may discharge across the edge of the insulating layer between pole tips on an MR head, and adjacent conductive layers which are exposed and positioned adjacent to a transducing gap at the flexure air-bearing surface adjacent a recording medium. Such discharge may cause erosion to the pole tips and degradation of the transducer in reading and writing of data, or the discharge may destroy the MR head in its entirety.

Several solutions have been proposed to alleviate the problem of ESD on MR heads. For example, U.S. Pat. No. 5,465,186 issued to Bajorek et al., discloses an inductive head having short discharge pads formed by the deposition of conductive material in recesses formed in an insulating layer so that the electrostatic discharge will occur in areas displaced from the critical pole tip and gap area of the slider air-bearing surface. U.S. Pat. No. 4,800,454 issued to Schwartz et al., discloses an inductive head assembly wherein the magnetic pole piece in the inductive coil winding are coupled to the slider to allow discharge of any static electric charges which may build up. The winding is connected to the slider body via a diode in high forward and reverse voltage drops or through a fusible link.

MR heads are well known and are particularly useful as read elements in magnetic transducers especially at high data recording densities. The MR head provides a higher output signal than an inductive read head. This higher output signal results in a higher signal to noise ratio for the recording channel and thus, allows higher area densities of recorded data on a magnetic disk surface to be achieved. As described above, when a MR head is exposed to ESD or even a voltage or current input larger than that intended under normal operating conditions referred to as electrical overstress (hereinafter EOS), the MR read sensor and other parts of the head may be damaged. This sensitivity to electrical damage is particularly severe for MR read sensors because these sensors have a relatively small physical size.

For example, an MR head used for extremely high recording densities will have a cross section of 100 Å by 1 μm, or smaller. The discharge of only a few volts through such a physically small resistive area is sufficient to produce currents capable of severely damaging or completely destroying the MR head. The nature of the damage which may be experienced by a MR head varies significantly including complete destruction of the MR head via melting and evaporation contamination of the air-bearing surface, generation of shorts via electrical breakdown and milder forms of damage in which the head performance may be degraded. This type of damage to the MR head has been found to occur during both processing and use and poses a serious problem for manufacturing and handling of magnetic heads incorporating MR read sensors.

To accommodate testing of the MR head for exposure to ESD during production, test pads 20 may be provided on the end of flex circuit 16 for attachment to a test device. Physical alignment between test pads 20 and the test device may be accomplished by means of a registration hole 22. As solder bumps 18, test pads 20, and the wiring through the gimbal 12 remain exposed during assembly, there is a potential for electrostatic charge to accumulate readily and create a hazardous environment for MR head 14.

It has been found that providing an electrical short across the wires of the MR head element is effective in minimizing or eliminating damage from ESD as this method serves to raise the threshold voltage necessary to result in a failure. The shorted wires function by shunting most of the ESD current around the MR head element. Bajorek et al. '186 discloses shorting the MR head element wires at the sensor input pads. However, during assembly of the MR head, removal of the shorting elements becomes a difficult and expensive procedure to incorporate. Thus, there is a need for an electrostatic discharge protection device which provides electrical shorting of the head elements yet allows for easy removal before the MR head is assembled to the magnetic disk storage device.

Commonly-assigned patents that provide electrostatic discharge protection devices for various semiconductor packages include: U.S. Pat. No. 5,108,299 "Electrostatic Discharge Protection Devices for Semiconductor Chip Packages"; U.S. Pat. No. 4,971,568 "Electrical Connector with Attachment for Automatically Shorting Select Conductors Upon Disconnection of Connector"; U.S. Pat. No. 5,163,850 "Electrostatic Discharge Protection Devices For Semiconductor Chip Packages"; and U.S. Pat. No. 5,164,880 "Electrostatic Discharge Protection Device for Printed Circuit Board" all issued to David V. Cronin. Co-pending U.S. patent applications include Ser. Nos. 08/278024 and 08/278063 "Electrostatic Discharge Protection Device," both filed Jul. 20, 1994, and Ser. No. 08/234,917 "Electrostatic Discharge Protection Device" filed Apr. 28, 1994, all by David V. Cronin.

Accordingly, it is an object of this invention to provide a device which can be used to minimize damage to MR heads from ESD or from electrical overstress of the MR head or other transducer components.

It is another object of this invention to provide an MR head having a configuration such that excessive current is shunted away from the MR element and other critical head components.

It is a further element of this invention to provide an ESD protection device that automatically withdraws when coupled to either a testing device or a printed circuit board.

These and other objects of the invention will be obvious and will appear hereinafter.

SUMMARY OF THE INVENTION

The aforementioned and other objects are achieved by the invention which provides an ESD protection method and device for protecting semiconductor chip packages, particularly, MR heads. The ESD protection device according to the present invention is suitable for use with a semiconductor chip package connected to a printed circuit board or such circuit by means of an electrical conductor.

The conductor is provided with a plurality of spaced apart conductive pads at its terminus for electrically communicating with a test device.

The plurality of spaced apart conductive pads have a surface adapted to receive an electrical connector. The electrostatic discharge protection device then selectively inhibits electrostatic charge accumulation by electrically connecting the spaced apart conductive pads, thus insuring a common electrical potential at each of the spaced apart conductive pads.

The electrostatic discharge protection device comprises a housing and a grounding element. The housing, in turn, comprises a base and a cap.

The base is adapted to secure the flex therein. The base generally has posts extended therefrom over which the cap is placed, thus interposing the flex therebetween.

The grounding element comprises a comb and a bar. The comb is conductive and is disposed in slots in the cap. The comb then extends out a portion of the cap where it is selectively placed into contact with the bar. The bar electrically connects each finger of the comb thus establishing a common electrical potential.

In practice, when test procedures are complete and the flex has been soldered to its ultimate point of termination, the electrostatic discharge protection device along with the portion of the flex having the test pads, are cut off. However, optionally, a disrupter can be inserted into the cap which withdraws the fingers of the comb from the bar, thus creating electrical isolation between the fingers of the comb.

In further aspects, the invention provides methods in accord with the apparatus described above. The aforementioned and other aspects of the invention are evident in the drawings and in the description that follows.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENTS

While the present invention retains utility within a wide variety of circuit board and conductor configurations and may be embodied in several different forms, it is advantageously employed in connection with a magnetic disk storage system having an MR head. Although this is the form of the preferred embodiment and will be described as such, the described embodiment should be considered as illustrative and not as restrictive. One skilled in the art will realize that the MR head discussed herein is one form of semiconductor chip package and that other electronic devices will similarly benefit from the methods taught by the present invention. Further, the invention is described with respect to a particular structure normally associated with an MR head. One skilled in the art will realize that the invention can be adapted to numerous configurations and electronic systems without departing from the essential characteristics of the invention.

Figure 1:
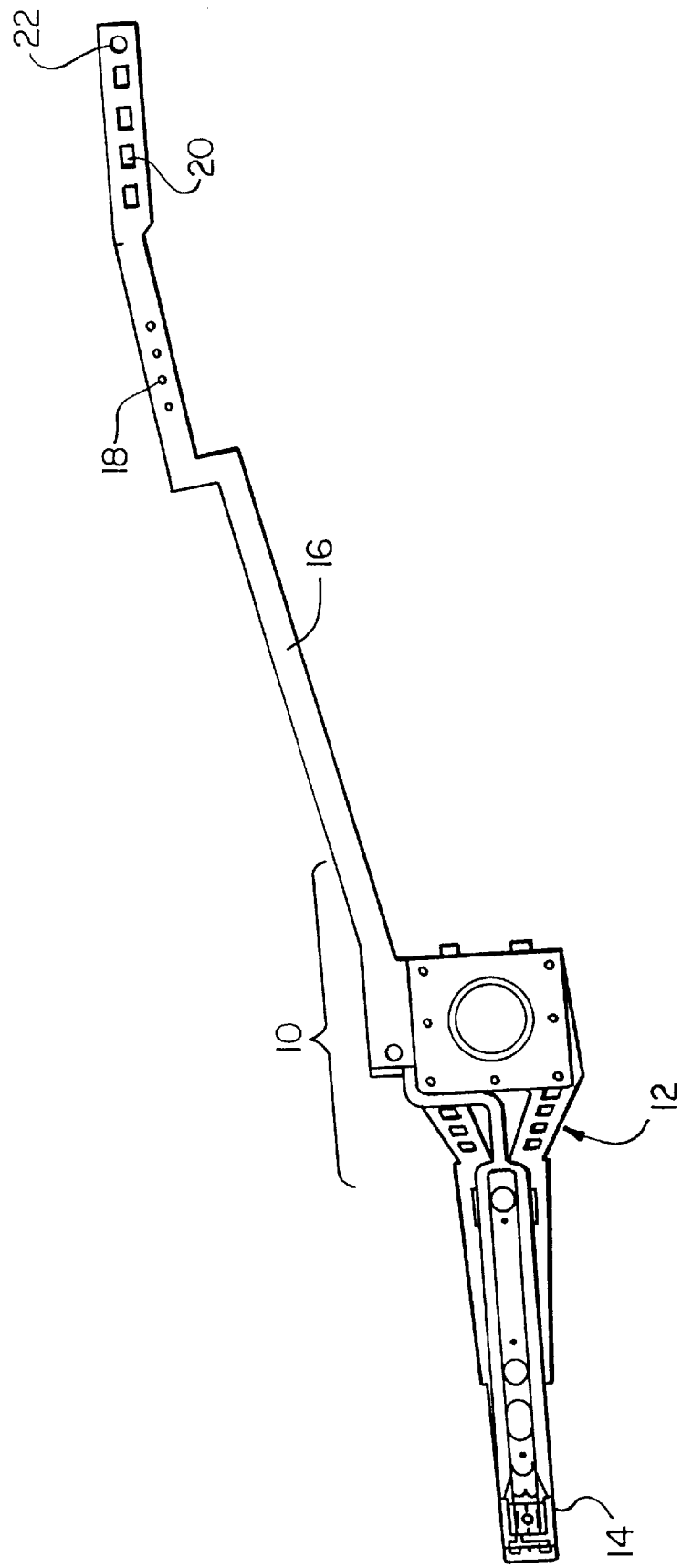
FIG. 1 is a top view of a conventional MR head assembly.
Figure 2:
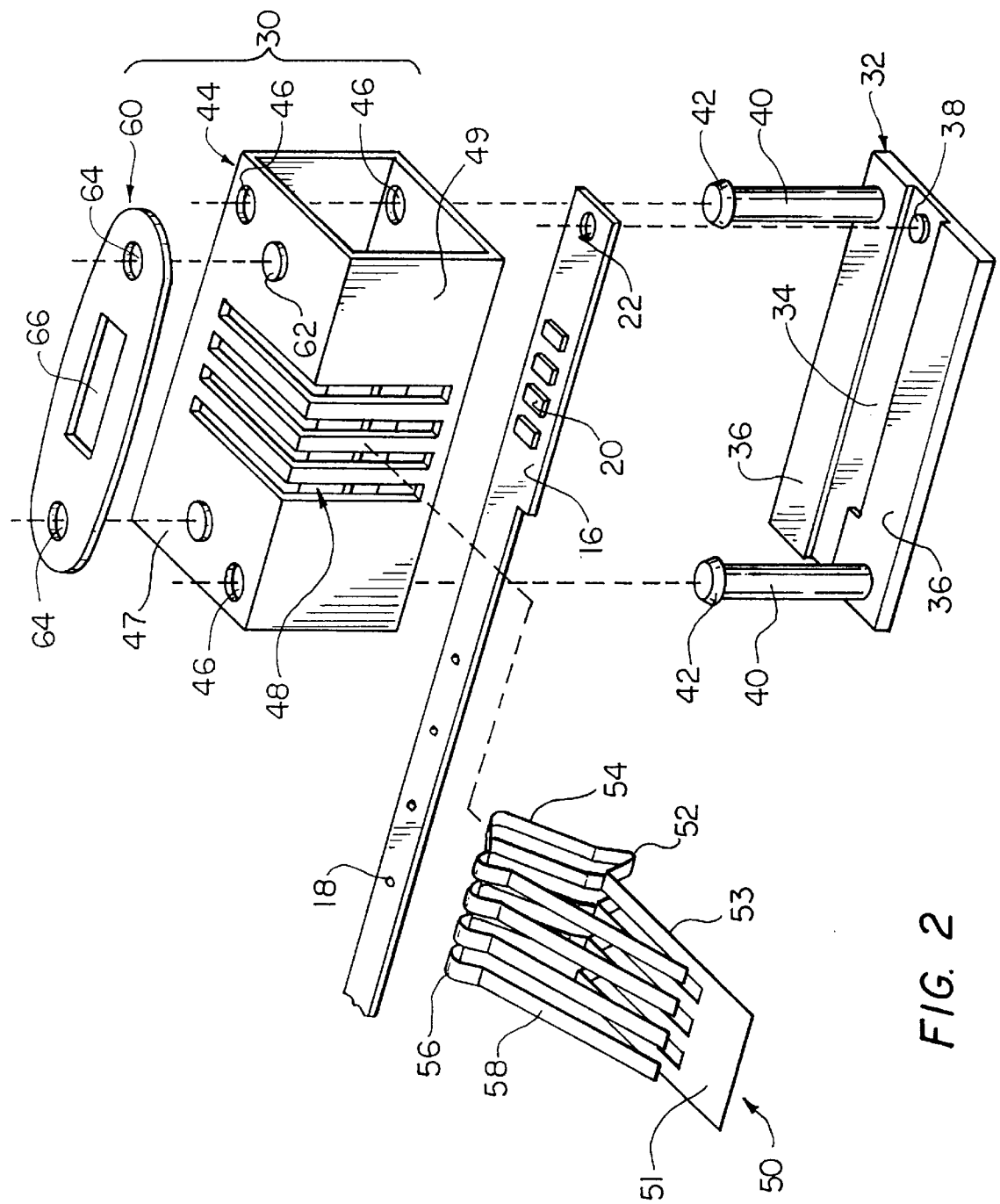
FIG. 2 is an exploded, perspective view of an electrostatic discharge protection device for use with a flex circuit.
Figure 3:
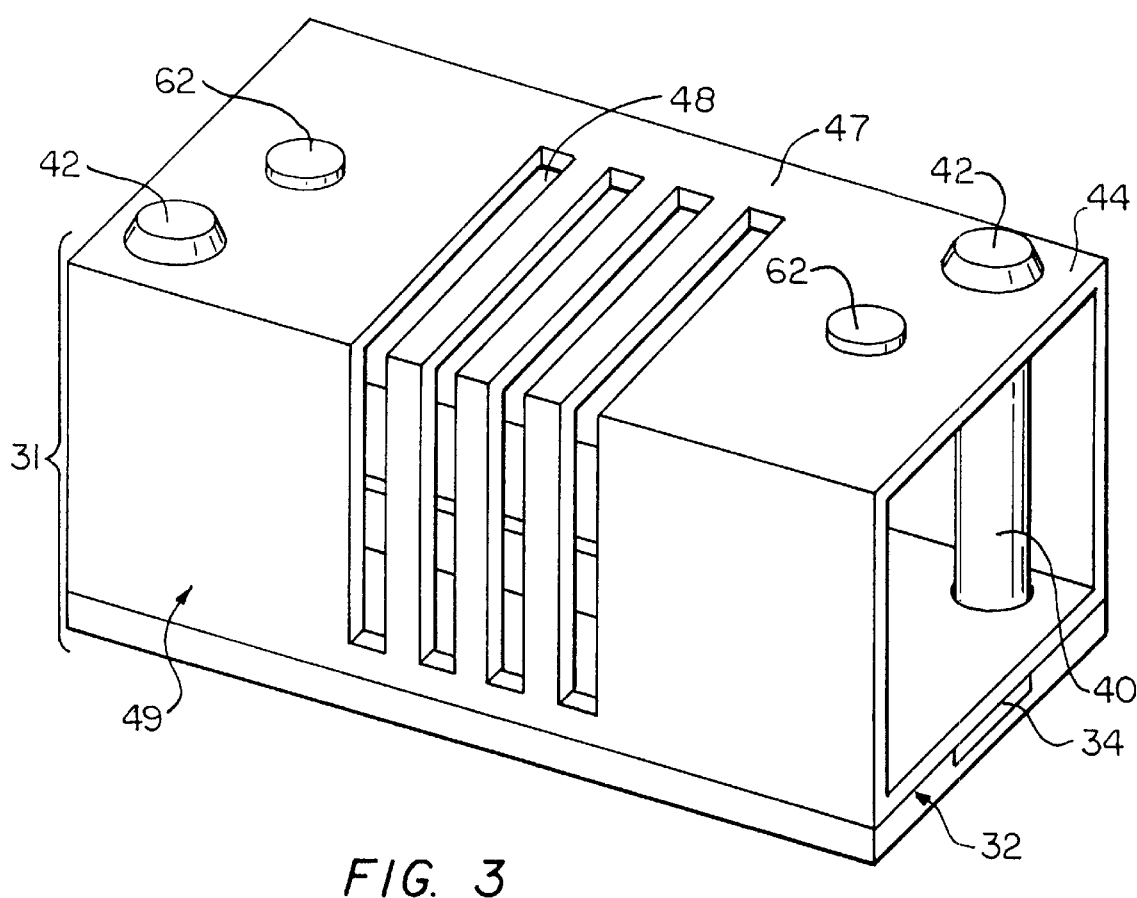
FIG. 3 is a subassembly of the electrostatic discharge protection device of FIG. 2.

Referring now to FIGS. 2 and 3, there is shown an electrostatic discharge protection device 30, comprising a housing 31, which is used to inhibit the accumulation of electrostatic charge on conductive surfaces of a mated semiconductor or semiconductor chip package. Housing 31 comprises a base 32 and a cap 44, where housing 31 and all the components thereof are preferably fabricated of a substantially dielectric or nonconductive material.

Flex circuit 16 is secured to housing 31 by placement into a channel 34 within base 32. Channel 34 is recessed into a top surface 36 of base 32 and is shaped to accommodate flex circuit 16. It should be understood that channel 34 is configured to conform to any one of various-shaped flex circuits, wires or printed circuit boards, as required by the particular application. Disposed within channel 34 is a registration protrusion 38 which mates with registration hole 22 on flex circuit 16 to insure proper alignment of flex circuit 16 within base 32. Extending substantially perpendicularly from top surface 36 of base 32 are posts 40. Cap 44 is inserted over posts 40 which serve to retain cap 44 to interconnect base 32. At a distal end of each of posts 40 is a head 42 formed into a substantially conical frustum to guide posts 40 into cap 44 during insertion. Posts 40 extend through securing holes 46 such that heads 42 protrude from a top surface of the cap 44 and lock cap 44 into position against base 32.

Cap 44 comprises slots 48 which extend from a top surface 47 to a front surface 49 of cap 44. Slots 48 are disposed in a spaced apart relationship substantially parallel to each other where the spacing substantially corresponds to the spacing of test pads 20. Slots 48 in cap 44 are so configured to receive a comb 50, fabricated of a substantially conductive material having an inherent, resilient property, such as a beryllium copper. Comb 50 has a tab 51 with a plurality of fingers 53 extending therefrom. Fingers 53 correspond to slots 48 which and to test pads 20 on flex circuit 16. As described in greater detail below, the one-to-one correspondence of fingers 53 to test pads 20 insures electrical conductivity between test pads 20 while electrostatic discharge protection device 30 is in an operative position.

Figure 4:
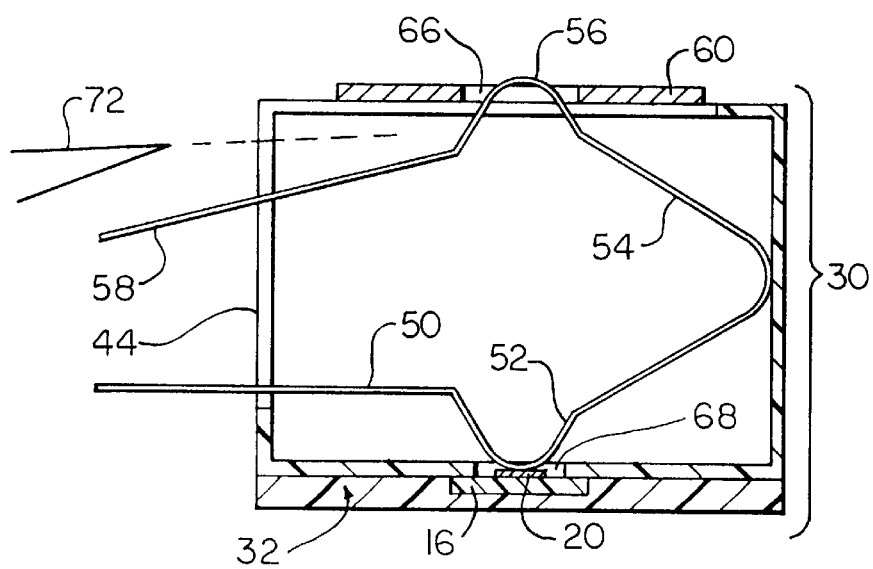
FIG. 4 is a cross-sectional view of the electrostatic discharge protection device of FIG. 2 in engagement with a flex circuit.

Referring now to FIG. 4, with continuing reference to FIGS. 2 and 3, finger contacts 52 on comb 50 extend down from fingers 53 through a bottom aperture 68 of cap 44. In this way, finger contacts 52 make mechanical and electrical contact with each of test pads 20 in flex circuit 16. Comb 50 is structured such that extending from finger contacts 52 are bends 54 which extend toward a back surface of cap 44 and curve back again toward front surface 49. Bends 54 have an inherent resilient bias such that ground contacts 56 are biased outward from the slots of top surface 47. Extending from ground contacts 56 are extensions 58 which may be used to move electrostatic discharge protection device 30 into an inoperative position.

Securing comb 50 in position is a bar 60, fabricated of a substantially conductive material, which has nub holes 64. Nub holes 64 mate with nubs 62 with an interference fit such that bar 60 is secured to cap 44 essentially permanently. A ground aperture 66 passes through bar 60 in alignment with ground contacts 56. This configuration allows ground contacts 56 to extend into ground aperture 66 and into mechanical communication with lateral surfaces of ground aperture 66. In this way, an electrical short circuit is established between each of test pads 20 via comb 50 thereby placing test pads 20 and associated conductors within flex circuit 16 at a substantially equivalent electrical potential and dissipating any electrostatic charge accumulation. In a preferred embodiment, bar 60 also comprises a resistive coating to reduce current flow between test pads 20. The resistance of the resistive coating decreases the current flow across bar 60 to minimize a risk of voltage spikes which can be as damaging to semiconductor chip packages as an electrostatic discharge.

In practice, tab 51 is removed once fabrication of the MR head is completed. Removal of tab 51 ensures that each of fingers 53 operate substantially independently. In this way, individual test pads 20 can be accessed for test purposes, for example, by selectively depressing the corresponding ground contact 56 to break electrical contact with bar 60. In an alternative embodiment, comb 50 can be fabricated of a substantially nonconductive material where fingers 53 are subsequently coated with a conductive coating. In this embodiment, tab 51 can remain in place so as to provide additional stability to the structure. The previously described independence can still be maintained as long as the conductive coating does not interconnect individual fingers 53.

During testing, or when electrical isolation of the conductors in flex circuit 16 is otherwise required, electrostatic discharge protection device 30 is moved into an inoperative position. One method of establishing electrical isolation is by forcing extensions 58 in opposition to the inherent resilient bias. This force moves ground contacts 56 away from bar 60. Another method of actuating electrostatic discharge protection device 30 into an inoperative position is achieved using a test device (not shown). In this method, tab 51 must also be removed or the tab must be fabricated from a nonconductive material as previously described. Since one of the functions of test pads 20 is to allow testing of the MR head (not shown), insertion of a mating test device over bar 60 can establish electrical isolation such that testing can be performed. The test device must simply have a protrusion which substantially corresponds to the shape of ground aperture 66. Ground contacts 56 are moved into electrical isolation with respect to bar 60 to allow testing of the MR head directly from ground contacts 56 without a need for removal of electrostatic discharge protection device 30. The withdrawal of the test device from ground aperture 66 allows the inherent resilient bias of comb 50 to re-establish the shunt across test pads 20 by automatically moving ground contacts 56 back into electrical contact with bar 60.

When testing has been completed and flex circuit 16 is electrically connected to a printed circuit board, for example, electrostatic discharge protection device 30 may be permanently disengaged. This can be accomplished by using a disrupter 72 which passes through slots 48 between extensions 58 and top surface 47 of cap 44. Disrupter 72 moves ground contacts 56 away from bar 60. In a preferred embodiment, disrupter 72 is fabricated of a nonconductive, pliable, resilient material, such as vulcanized rubber, which is formed to have an interference fit with slots 48. This structure provides for relative ease of insertion into slots 48 while being resistive to removal due to the frictional interaction between slots 48 and disrupter 72.

In another embodiment, a device that operates in a manner similar to that of a test probe is used. The device simply forces a protrusion into ground aperture 66 thus forcing the ground contacts 56 away from bar 60. In practice, there is another widely utilized alternative for attaining the inoperative position. Once testing is complete, it is common in these devices to cut off the portion of flex circuit 16 having test pads 20. Therefore, continuing this practice with electrostatic discharge protection device 30 engaged would similarly accomplish the goal of rendering electrostatic discharge protection device 30 inoperative. Flex circuit 16 is severed immediately before test pads 20, thus removing test pads 20 and electrostatic discharge protection device 30.

Figure 5:
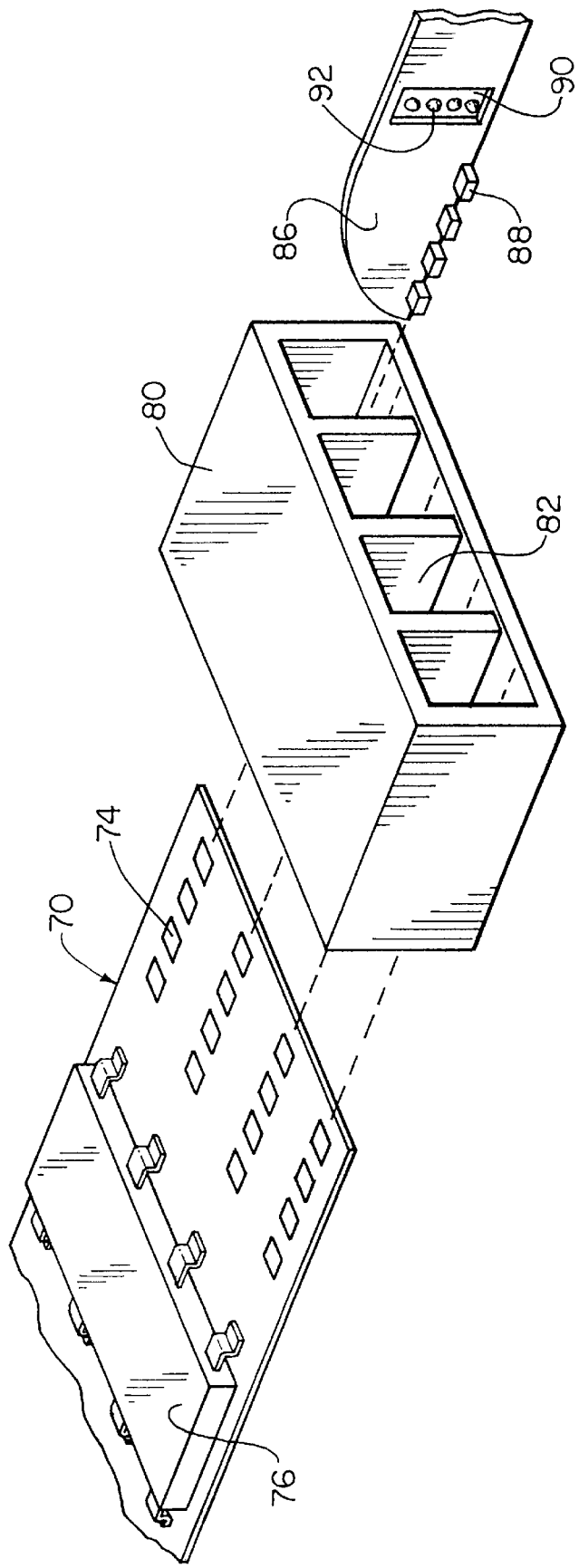
FIG. 5 is an exploded view of an alternative embodiment of an electrostatic discharge protection device in accordance with the present invention.

Once electrostatic discharge protection device 30 is electrically disengaged from flex circuit 16, MR head may again be subject to electrostatic charge accumulation. FIG. 5 shows one embodiment of a connector-receptor assembly that provides electrostatic discharge protection up until the moment of interconnection of the MR head into a higher assembly. In this embodiment, a receptor 80 requires a vertical orientation and, therefore, this discussion will show how such an orientation can be obtained. One skilled in the art will realize that a horizontal orientation may at times be desirable and that the disclosed embodiment can be modified to accommodate such a design. For the purpose of illustration, a second flex 70 is shown having connection pads 74 disposed in rows where each row corresponds to a single MR head, as is commonly found in the industry. Four rows corresponding to four MR heads are shown, although in practice the actual number may vary depending upon the number of heads in the magnetic disk drive. One skilled in the art will also realize that the choice of a second flex, rather than a direct connection to a printed circuit board, is illustrative and can be interchanged without detriment to the invention. Also shown is an amplifier 76 which receives and amplifies signals from the individual MR heads. Amplifier 76 is shown for completeness of the illustration as the structure generally appears in practice and should not be read as being in any way limiting of the invention.

Figure 6:
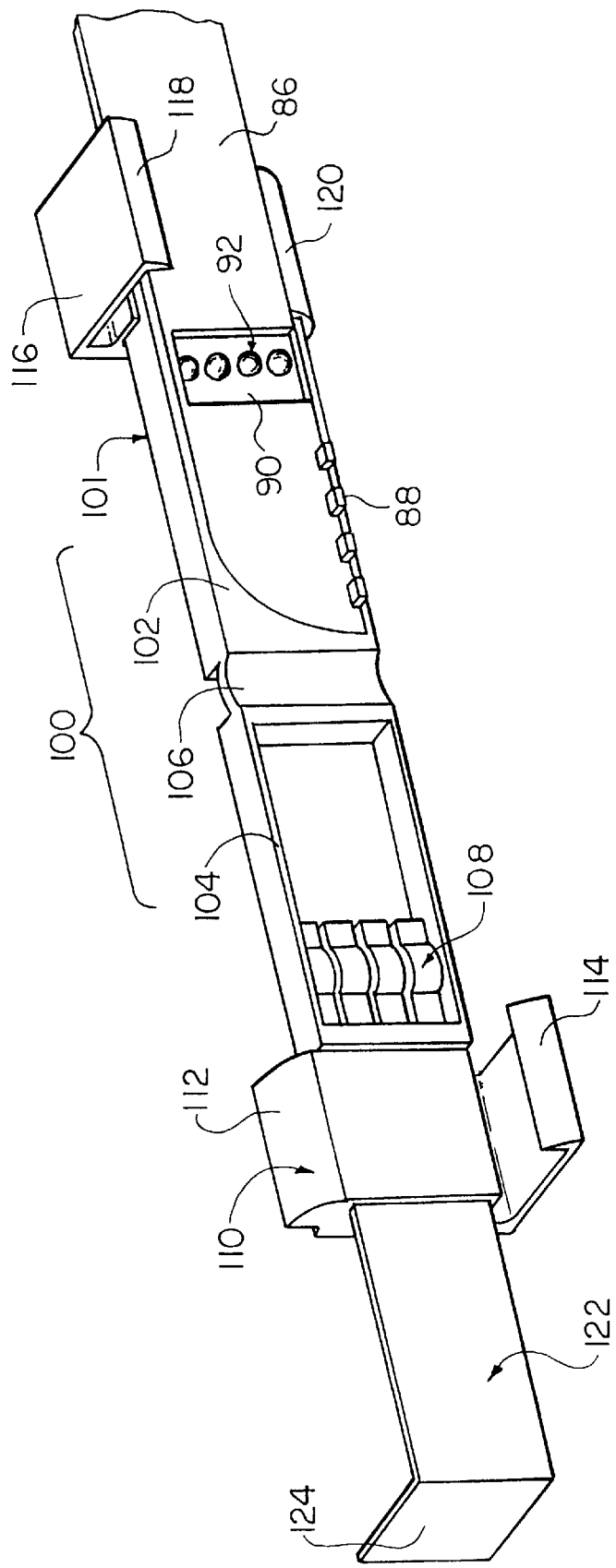
FIG. 6 is a connector suitable for use with the electrostatic discharge protection device of FIG. 5.

The connector-receptor assembly structure operates by providing receptor 80 which has individual bays 82 corresponding to each of the rows of connection pads 74. As best seen in FIG. 6, a housing 101 slides over flex 70 such that the rows of connection pad 74 are segregated into individual bays 82. Housing 101 provides space below each of bay separators 103 to accommodate flex 70 with an interference fit. In order to obtain a vertical orientation and to make a proper connection from flex circuit 16 previously described, an auxiliary flex 86 is used. Auxiliary flex 86 can be electrically connected to solder bumps 18 on the flex previously described or a new flex can be used in place of flex circuit 16 previously described, to produce a configuration in which auxiliary flex 86 extends perpendicularly to second flex 70.

Transverse pads 88 extend from a bottom portion of auxiliary flex 86 in spaced apart relation to each other where each of transverse pads 88 correspond to a conductor in auxiliary flex 86. When inserted into the bay 82 which already has flex 70 inserted therein, transverse pads 88 are placed in electrical connection with connection pads 74. An electrical continuity is then created between second flex 70 and auxiliary flex 86 while maintaining electrical isolation among individual transverse pads 88. Auxiliary flex 86 has a window 90 which is an aperture within an insulative surface of auxiliary flex 86. Window 90 provides access to solder bumps 92 each of which is associated with an individual conductor within auxiliary flex 86 and which can be used to make additional connections for test purposes or for electrostatic discharge protection.

In receptor 80 described above, each of bays 82 corresponds to an MR head assembly and proper registration must be made between each of the conductive elements to insure proper operation of the device. Thus, to further ensure proper registration, a plug 100 interconnects with auxiliary flex 86 for insertion into bays 82. Plug 100 has a housing 101 comprised of a first lateral surface 102 and a second lateral surface 104. First lateral surface 102 has a recess therein to accept auxiliary flex 86. Second lateral surface 104 is closed over auxiliary flex 86 by rotating second lateral surface 104 about a hinge 106. When second lateral surface 104 is thus rotated, a snap receptor 110 engages such that housing 101 locks securely on flex 86.

Figure 7:
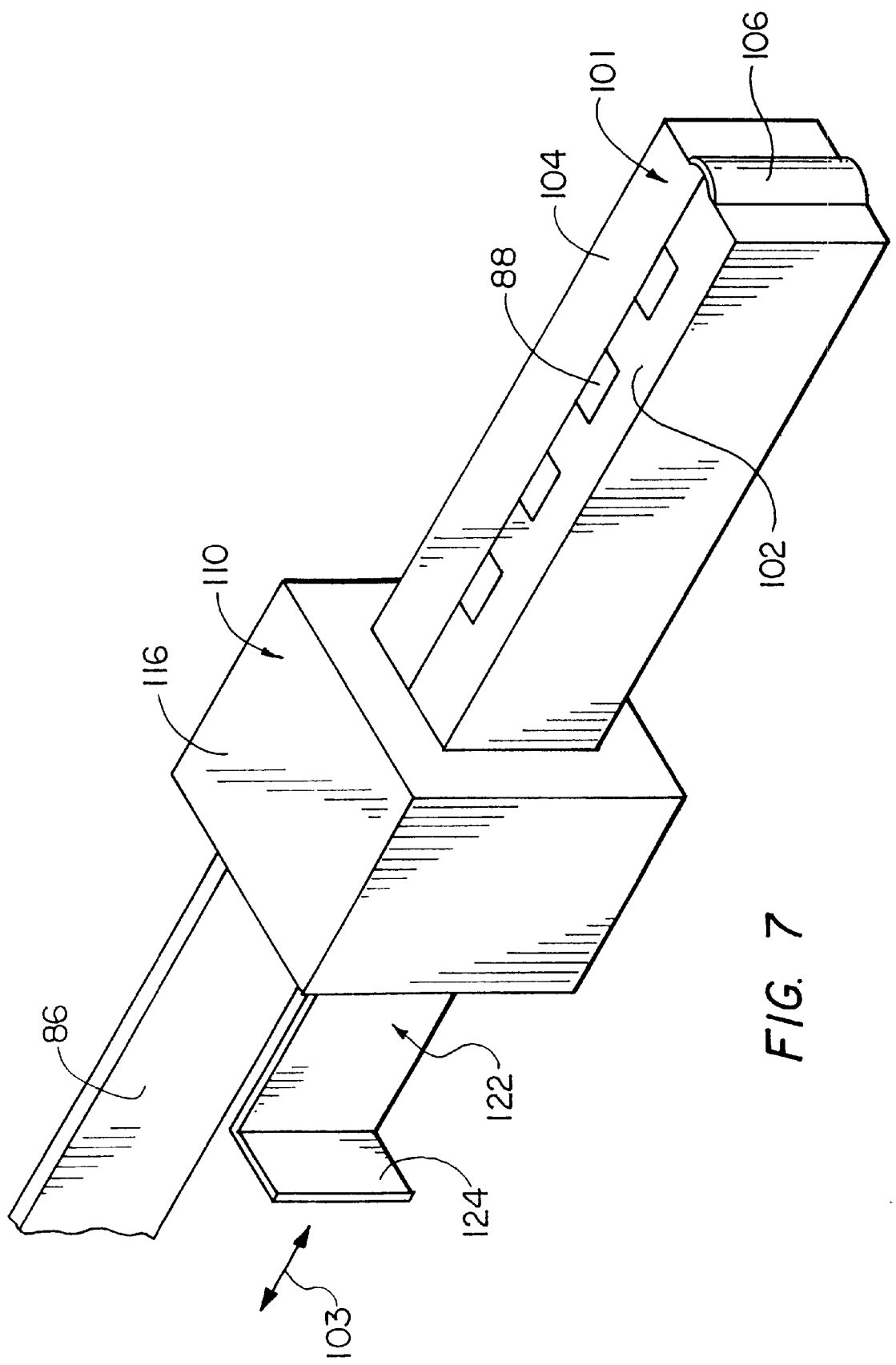
FIG. 7 is a perspective view of the connector of FIG. 6 in a closed position.

Snap receptor 110 engages when a ramp 112 is guided into a snap mechanism 116 where a wedge 118 rides up ramp 112 until wedge 118 drops down from wedge 112. A substantially planar surface of wedge 118 is then opposed to a substantially planar surface of ramp 112. This surface-to-surface interaction inhibits reopening of housing 101 and locks first lateral surface 102 into mechanical contact with second lateral surface 104, as is best shown in FIG. 7. When housing 101 is in this closed position, a mating connector 120 also mates with a bottom portion of snap receptor 110 over a disengaging mechanism 114. Mating connector 120 further ensures closure of plug 100 but allows disengaging mechanism 114 to be used to disconnect first lateral surface 102 from second lateral surface 104 when needed.

When housing 101 is closed, a shorting comb 108 engages solder bumps 92 in auxiliary flex 86 such that an electrical path is formed between solder bumps 92. Shorting comb 108 is fabricated of a substantially electrically conductive material which may be coated with a resistive coating, as previously described. Shorting comb 108 establishes an electrically short circuit between solder bumps 92 such that electrostatic charge accumulation on the MR head associated with auxiliary flex 86 is inhibited. Shorting comb 108 is integral with a slide 122 having a slide handle 124. Slide 122 is optionally made as a separate element which is nonconductive such as plastic and which is in turn connected to shorting comb 108 or it could be substantially unitary with shorting comb 108. In either case, in this embodiment slide 102 is made such that movement of slide 122 relative to a central axis of plug 100 causes shorting comb to move relative to solder bumps 92, as is indicated by arrow 103. Thus, manual actuation of plug 100 acting as an electrostatic discharge protection device can be achieved by sliding slide 122 substantially parallel to a central axis of plug 100 thereby moving shorting comb 108 out of electrical connection communication with solder bumps 92. When testing is completed, slide 122 can also be used to move shorting comb 108 back into electrical communication with solder bumps 92, thus reversing the above-described disengagement and re-establishing electrostatic discharge protection for the MR head.

Figure 8:
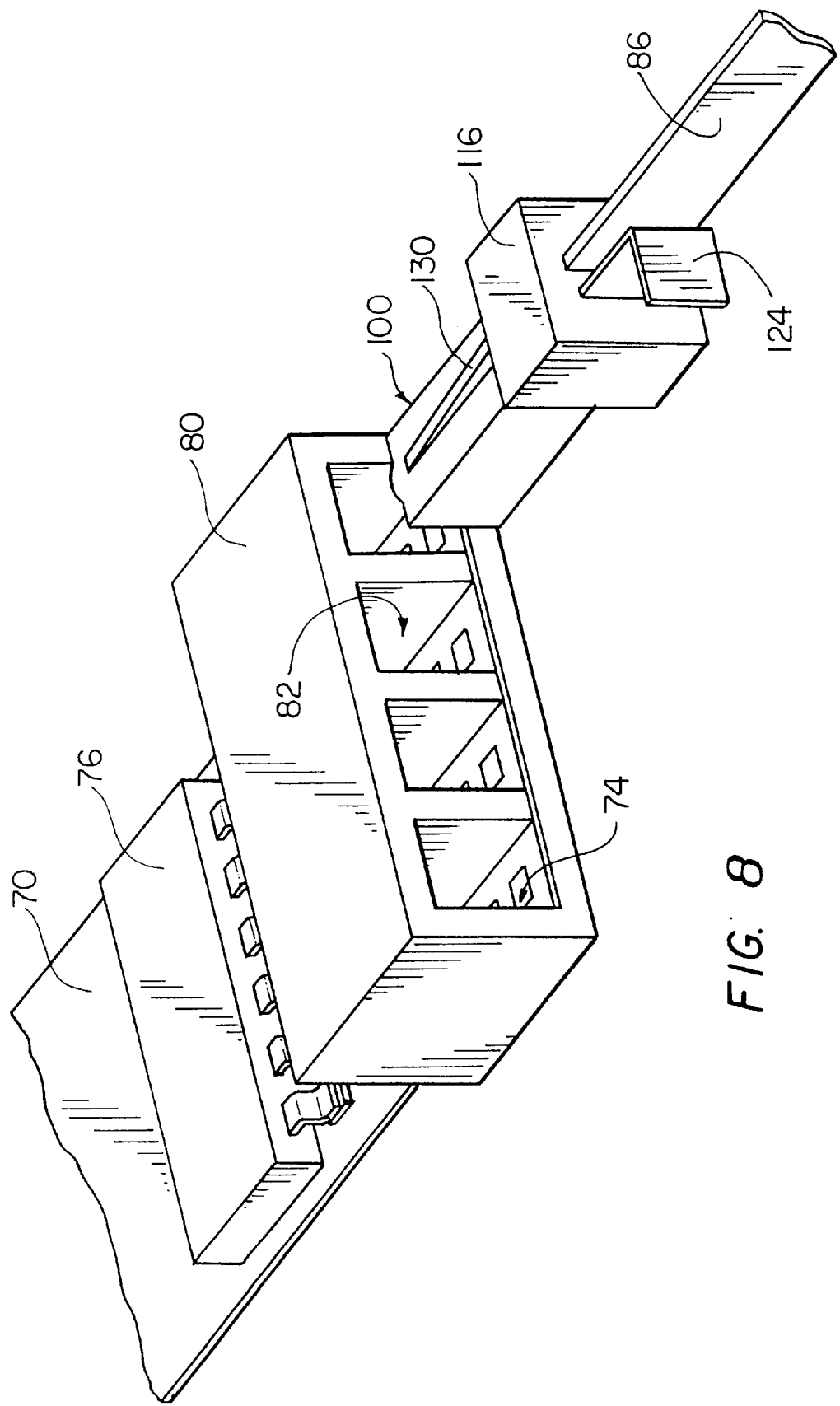
FIG. 8 is a perspective view of the connector of FIG. 7 shown inserted into the housing of FIG. 5.

Referring now to FIG. 8, plug 100, comprising a plug wedge 130, is shown interconnected with receptor 80. Plug wedge 130 extends upwards from plug 100 such that when plug 100 is inserted into receptor 80, plug wedge 130 is forced against a top surface of bay 82, thus forcing plug 100 down away from top surface of receptor 80. Since transverse pads 88 are substantially opposed from plug wedge 130, this mechanical action forces transverse pads 88 into tighter mechanical contact with connection pads 74 and creates an interference fit of plug 100 into bay 82 of receptor 80.

Figure 9A:
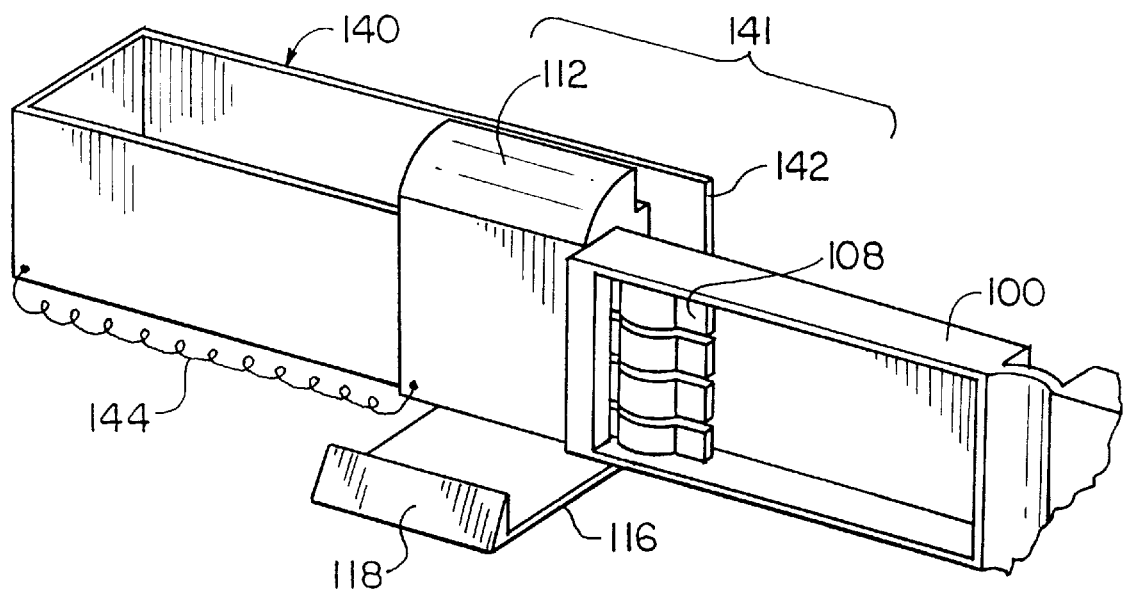
FIGS. 9A and 9B illustrate an alternative embodiment of the electrostatic discharge protection device of FIGS. 5 through 8.
Figure 9B:
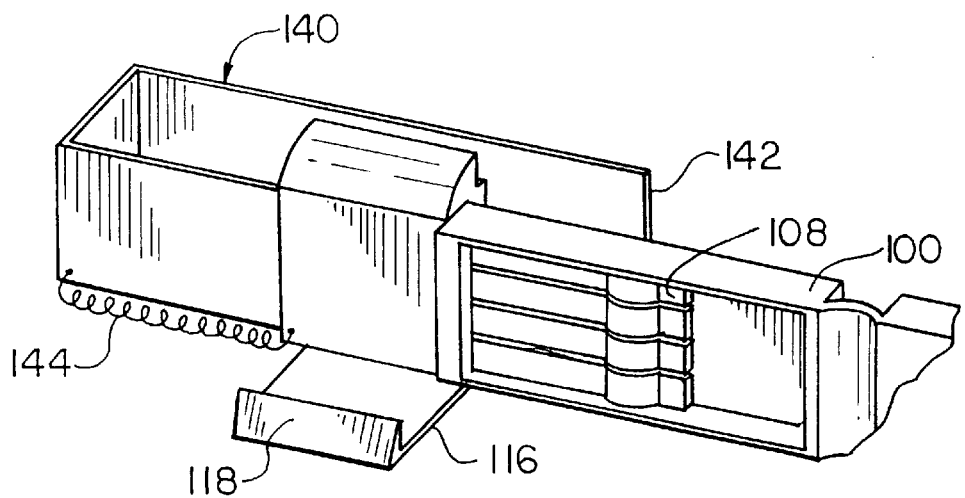

Referring now to FIGS. 9A and 9B, there is shown an alternative embodiment of plug 100. FIG. 9A shows the electrostatic discharge protection device in an inoperative position and FIG. 9B shows the electrostatic discharge protection device in an operative position. In this embodiment, an automatic slide 140 is used having a substantially 'U'-shaped structure. Automatic slide 140 is designed such that an impact edge 142 makes mechanical contact with a front portion of the receptor 80 such that automatic slide 140 is forced outward. Automatic slide 140 is generally biased inward towards plug 141 by an elastic element, such as spring 144.

Automatic slide 140 normally positions shorting comb 108 in electrical contact with solder bumps 92. When plug 100 is moved into receptor 80, impact surface 142 strikes a front portion of receptor 80, thus moving the automatic slide outward with respect to plug 141 substantially coaxially therewith. This movement overcomes the inward bias provided by spring 144 and moves shorting comb 108 away from solder bumps 92, thus establishing electrical isolation among solder bumps 108. Removal of plug 141 from receptor 80 removes the force placed against impact surface 142. Spring 144 subsequently reasserts its inward bias moving automatic slide 140 into plug 141, thereby again moving shorting comb 108 into electrical contact with solder bumps 92 and re-establishing electrostatic discharge protection.

The invention may be embodied in other specific forms without departing from the spirit or essential characteristics thereof. The present embodiments are, therefore, to be considered in all respects as illustrative and not restrictive, the scope of the invention being indicated by the appended claims rather than by the foregoing description, and all changes which come within the meaning and range of equivalency of the claims are therefore intended to be embraced therein.

The embodiments of the invention in which an exclusive property or privilege is claimed are defined as follows:

1. An electrostatic discharge protection device suitable for inhibiting electrostatic charge accumulation on an electronic device attached to a plurality of electrical conductors terminating in a plurality of electrical contacts, said electrostatic discharge protection device comprising:

a housing adapted to enclose the plurality of electrical contacts;

an electrically-conductive bar disposed upon a surface of said housing; and, a comb disposed within said housing, said comb removably disposed against said bar and the electrical contacts such that said comb electrically interconnects the plurality of electrical contacts so as to place the electrical contacts at the same electrical potential when said comb is in an operative position, and said comb is electrically isolated from said bar when said comb is in an inoperative position.

2. The electrostatic discharge protection device according to claim 1 wherein said housing comprises:

a base comprising a first surface adapted to receive the electrical contacts; and a cap adapted to receive said comb, said cap adapted to mate with said base such that said electrical contacts are retained between said cap and said base.

3. The electrostatic discharge protection device according to claim 2 wherein said base further comprises a recess adapted to receive the electrical contacts.

4. The electrostatic discharge protection device according to claim 2 further comprising a disrupter insertable between said cap and said comb to place said comb into said inoperative position.

5. The electrostatic discharge protection device according to claim 1 wherein said electrically conductive bar secures said comb within said housing.

6. The electrostatic discharge protection device according to claim 1 wherein said electrically conductive bar further comprises a resistive coating.

7. The electrostatic discharge protection device according to claim 1 wherein said electrically conductive bar comprises an aperture adapted to receive a mating connector which moves said comb into said inoperative position.

8. The electrostatic discharge protection device according to claim 7 wherein said mating connector comprises a test probe which electrically communicates with one or more of the plurality of electrical contacts via said comb.

9. The electrostatic discharge protection device according to claim 1 wherein said housing comprises a first side and a second side which align to secure the electrical contacts therebetween.

10. The electrostatic discharge protection device according to claim 1 wherein said comb and bar are manually operable to removably and replaceably establish electrical an electrical shunt across the plurality of electrical contacts.

11. The electrostatic discharge protection device according to claim 10 wherein said comb further comprises a handle that slides substantially parallel to an axis of said housing to move said comb relative to the plurality of electrical contacts.

12. The electrostatic discharge protection device according to claim 1 wherein said housing is insertable into a receptor attached to a plurality of external electrical leads, the joining of said housing with said receptor establishing electrical communication between the electrical contacts and the electrical leads.

13. The electrostatic discharge protection device according to claim 1 further comprising a receptor, said comb being reversibly actuable from said operative position to said inoperative position by connecting said housing with said receptor.

14. A method for selectively inhibiting electrostatic charge accumulation on an electronic device having a plurality of electrical contacts in electrical isolation from one another, said method comprising the steps of:

securing the electrical contacts within a housing;

placing the electrical contacts at the same electrical potential by means of a resilient comb establishing electrical communication between an electrically conductive bar disposed upon said housing and the plurality of electrical contacts; and electrically isolating the electrical contacts from one another by urging said comb away from said electrically conductive bar.

* * * * *